United States Patent [19]

Tarui et al.

[11] 3,919,007

[45] Nov. 11, 1975

[54] METHOD OF MANUFACTURING A FIELD-EFFECT TRANSISTOR

[75] Inventors: Yasuo Tarui, Tokyo; Yutaka Hayashi, Hoya; Toshihiro Sekigawa, Yokohama, all of Japan

[73] Assignee: Kogyo Gijutsuin, Japan

[22] Filed: Mar. 15, 1973

[21] Appl. No.: 341,756

Related U.S. Application Data

[62] Division of Ser. No. 61,906, Aug. 7, 1970, abandoned.

[30] Foreign Application Priority Data

| | | |
|---|---|---|
| Aug. 12, 1969 | Japan | 44-63257 |
| Sept. 18, 1969 | Japan | 44-73849 |
| Oct. 14, 1969 | Japan | 44-81501 |
| Oct. 14, 1969 | Japan | 44-81502 |
| Oct. 14, 1969 | Japan | 44-81503 |
| Oct. 20, 1969 | Japan | 44-83209 |

[52] U.S. Cl. ................ 148/189; 148/187; 148/188; 148/175; 148/190; 357/22

[51] Int. Cl. ................ H01l 7/44

[58] Field of Search ........... 148/188, 187, 1.5, 175, 148/190; 317/235 B

[56] References Cited

UNITED STATES PATENTS

| | | | |
|---|---|---|---|
| 3,454,846 | 7/1969 | Haenichen | 148/187 UX |
| 3,575,743 | 4/1971 | Chiovarou et al. | 148/187 |
| 3,598,664 | 8/1971 | Kilby | 148/187 X |
| 3,600,642 | 8/1971 | Allison et al. | 148/175 X |
| 3,601,888 | 8/1971 | Engeler et al. | 148/190 X |
| 3,608,189 | 9/1971 | Gray | 148/190 X |
| 3,685,140 | 8/1972 | Engeler | 148/190 X |
| 3,713,911 | 1/1973 | Larkin et al. | 148/187 |

*Primary Examiner*—G. Ozaki
*Attorney, Agent, or Firm*—Robert E. Burns; Emmanuel J. Lobato; Bruce L. Adams

[57] ABSTRACT

The method for making an improved field-effect transistor by using a thick insulating layer, the thickness of which is larger than the diffusion length of the impurity forming the base region in a following process step, as a mask for successive diffusion of two different impurities of different conductivity types and by using a portion of the thick insulating layer on the drain region as a portion of the gate insulating layer to reduce a parastic capacitance between the gate and the drain.

1 Claim, 21 Drawing Figures

METHOD OF MANUFACTURING A FIELD-EFFECT TRANSISTOR

The present application is a division of application Ser. No. 61,906 filed Aug. 7, 1970 and now abandoned.

BACKGROUND OF THE INVENTION

In the conventional field-effect transistors, there exist the following drawbacks.

1. Particularly, in field-effect transistors in which the effective base width is determined by impurity diffusion length or by the difference between impurity diffusion lengths, it has been very difficult to attain desirable high frequency characteristics due to intrinsic characteristics determined by said effective base width.

2. Parasitic capacitance or feedback capacitance between gate and drain, or parasitic capacitance between drain and base, or between gate or drain and other electrodes cannot be reduced to a negligible extent, wherefore these parameters affect frequency characteristics, stable amplification and the like.

3. Various functions are affected by the accuracy of photoengraving dimensions and photoengraving positioning.

4. Fluctuation of drain resistance is relatively large.

SUMMARY OF THE INVENTION

Therefore, it is an object of the invention to provide a field-effect transistor adapted to super high frequency, in which the main cause of a limitation preventing such frequency characteristics due to the effective base width is removed.

It is another object of the invention to provide a field-effect transistor which is protected from an excess increase of the capacitance between gate and drain.

It is another object of the invention to provide a field-effect transistor (in which the feedback capacitance between gate and drain is made small by increasing the thickness of the insulating layer at a position above the drain region, thereby improving frequency characteristics and a stable amplification even in the range near its cut-off frequency.

The foregoing and other objects of the invention and functions and characteristic features of the invention will become apparent from the following detailed description taken in conjunction with the accompanying drawings, in which the same or equivalent members are designated by the same numerals and characters.

DETAILED DESCRIPTION OF THE INVENTION

If the channel length of a field-effect transistor can be made substantially equal to the base width of a bipolar transistor, the high frequency characteristics of said field-effect transistor may be more excellent than those of the conventional bipolar transistor from a theoretical point of view. However, frequency characteristics of the conventional field-effect transistors are inferior to those of the conventional bipolar transistors because of the following reasons.

a. Channel length of the field-effect transistor depends generally on the photoengraved dimension in the plane direction and can hardly be made to be less than a few microns.

b. If the channel length of the field-effect transistor is made to be extremely short, electric characteristics such as output conductance and break-down voltage in said transistor become inferior. Consequently, for the purpose of making the channel length of the field-effect transistor short so that its electric characteristics such as output conductance and the like may be maintained within practical range, impurity concentration of the drain region at least one portion thereof adjacent to the channel should be lower then that of semiconductor region forming the channel.

Hithertofor, such construction as mentioned above has required a highly accurate photoengraving technique, that is, minute positioning with high accuracy.

Figure 1:
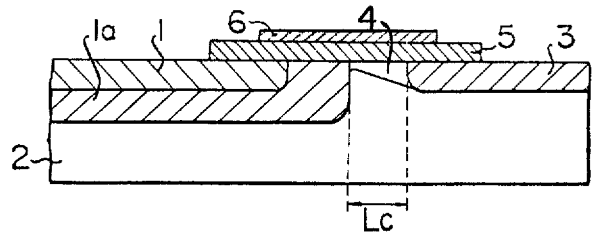
FIG. 1 shows a sectional view of a conventional gate insulating type field-effect transistor.

Prior to detailed description of an example of the invention, a conventional method of manufacturing a field-effect transistor will be described in connection with FIG. 1, as follows. If in a field-effect transistor comprising a drain region 1*a*, a semiconductor base region 2 forming a channel 4 therein, a drain region 1, a source region 3, a gate electrode 6, and the gate insulating layer 5, improvement of electrical characteristics and making the channel length $L_c$ short are contemplated by providing the drain region 1*a* impurity concentration of which is lower than that of the semiconductor region 2 forming the channel 4 therein, positioning procedure for manufacturing various regions with photomasking requires high accuracy in the case of the conventional method, because the drain region 1*a* having a low impurity concentration and both the drain region 1 and the source region 3 having a high impurity concentration are to be individually manufactured with different photomasks, and positioning of plane pattern of the region 1*a* with plane pattern of the regions 1 and 3 should be attained with extremely high accuracy.

Furthermore, since determination of lower limit of the channel length $L_c$ depends also on dimension accuracy of photoengraved plane pattern of the source region 3, it has been hardly possible to obtain a channel length less than 1 micron.

Figure 2:
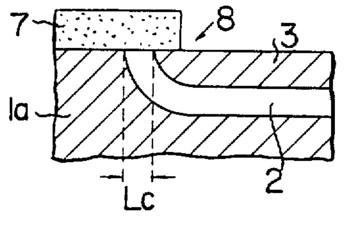
FIG. 2 shows a sectional view of an essential part of an example according to an improvement of the transistor shown in FIG. 1.

An example of the improvement of the field effect transistor shown in FIG. 1 will be described in connection with FIG. 2, in which the numerals 1*a*, 2, 3, 7 and 8 indicate, respectively, a drain region, a semiconductor base region in which a channel is formed, a source region, an oxide layer made of $SiO_2$ and used as a mask used in diffusion process, and a diffusion hole. In this example, the semiconductor base region 2 and source region 3 are formed by double diffusion or alloying and/or diffusion by means of the same positioning means utilizing the diffusion hole 8, so that it is only necessary to determine the channel length $L_c$ by the portion of the difference between diffusion lengths of said regions 2 and 3 or between said region 1*a* and said diffused region 3, said portion being exposed on the semiconductor surface. In this case, since the impurity concentration of the drain region 1*a* becomes lower than that of the region 2 forming the channel therein, electrical output characteristics would not become inferior in comparison with the conventional case, even when the channel length $L_c$ is made to be very short.

Figures 3A, 3B:
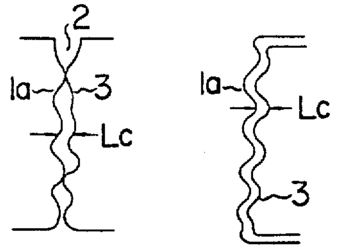
FIGS. 3(*a*) and 3(*b*) show, respectively, conventional and the improved steps for determining channel lengths.

According to the method of determining channel length by means of double diffusion from the same diffusion hole, even when irregularity is produced at end edges of the photoengraved plane pattern, a predetermined channel length $L_c$ is always obtained as shown in FIG. 3(*b*), but when different photomasking patterns are utilized as in the conventional cases, edge of the plane pattern for determining the source region 3 and that of the plane pattern for determining the drain region 1*a* are different in their shapes as shown in FIG. 3(*a*) and accordingly, the channel length $L_c$ becomes irregular, whereby in the case of manufacturing an element with a photoengraving accuracy near its limit, the source region 3 and drain region 1*a* are brought in contact with each other, thus causing electrical short-circuit.

Figure 4:
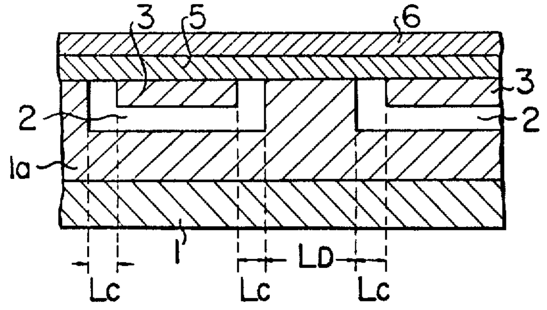
FIG. 4 shows a sectional view of an example according to the improved step of FIG. 3(*b*)
Figure 5:
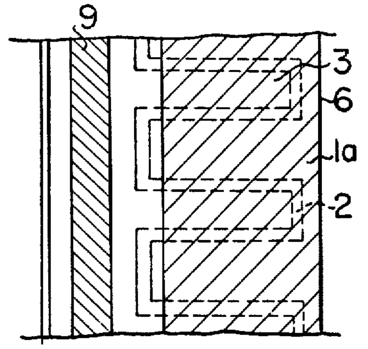
FIGS. 5 and 6 are plane views of the example shown in FIG. 4.
Figure 6:
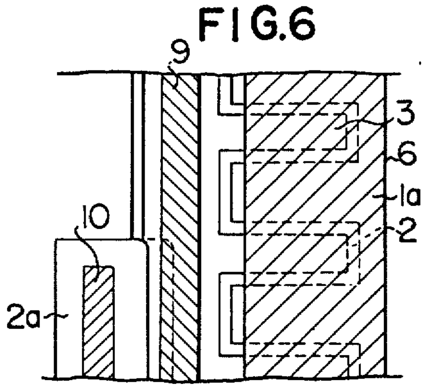

Referring to actual examples of the improved transistor structure shown in FIGS. 4, 5, and 6, the transistor comprises a source region 3, a drain region 1*a*, a semiconductor base region 2 forming a channel therein, a gate insulating layer 5, a gate electrode 6, and a semiconductor substrate 1 corresponding to drain region having a large impurity concentration. If impurity concentration N (number of atoms/$cm^3$) of the drain region 1*a* having a low impurity concentration and distance $L_D$ (micron) between the semiconductor base regions 2 satisfy the following relation $$4 \times 10^7 / \sqrt{N} \geq L_D$$

and silicon is used as the semiconductor, a depletion region spreads under the gate electrode 6 even in the case of zero drain voltage, thus causing remarkable decrease of the feedback capacitance between the gate electrode and drain region. Accordingly, even when the gate electrode 6 is provided along and above the drain region 1*a*, semi-conductor base region 2 and source region 3, frequency characteristics of the transistor are not deteriorated, so that minute dimension of the gate electrode 6 is not required even when channel length is extremely short differring from the case of conventional MOS field-effect transistors, thus causing no necessity of extreme accuracy of the photoengraving. FIG. 5 shows a plane structure of the transistor shown in FIG. 4 and illustrates that the gate electrode 6 is provided on the gate insulating layer 5 and extends along and above the main operating region, i.e., the comb-shaped source region 3 and base region 2 in which channel is formed, and a contact 9 to be connected to the source region 3 is provided at a position adjacent to said regions 2 and 3. As will be understood from the structure shown in FIG. 5, the parts requiring accurate photoengraving with respect to dimension are only the width portions of the rectangular comb-shaped structure and the portions affecting the positioning of the contact 9 on the source region 3, and the main operating region is not affected by photoengraving.

In other words, if it is assumed that the ratio of gate-channel capacitance to resultant capacitance consisting of the gate-source capacitance and gate-drain capacitance is made the same as that in the conventional transistor, it is easy to obtain a channel length of about 0.5 micron in the case when minimum dimension of the photoengraving is 1 micron, and furthermore, the channel length can be made very short irrespective of minimum dimension of the photoengraving, whereby frequency characteristics also can be improved in proportion to said decrease of the channel length.

Referring to example shown in FIGS. 4, 5, and 6, leading-out of a terminal from the base region 2 in which the channel is formed can be easily attained by a region 2*a* the conductivity type of which is the same as the region 2 and which is provided by another processing step, into which the source region 3 is not diffused and by leading out said region 2*a* through a contact 10, as shown in FIG. 6. However, even when the region 2 is electrically floated, voltage gain can be still high, because capacitance between the region 2 and the drain region 1*a* can be made to be less than 1/10 of the capacitance between the regions 2 and 3 by means of selecting the impurity concentration in a suitable manner.

The method of manufacturing the transistor illustrated in FIG. 4 will be described in detail in connection with FIG. 7.

Figure 7A:
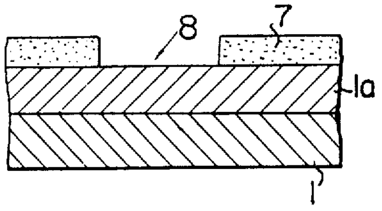
FIGS. 7(*a*), (*b*), (*c*) and (*d*) show, respectively, processes for manufacturing the example of FIG. 4.

1. A diffusion hole 8 adapted to selective diffusion is firstly formed in an oxide layer 7 by means of photoengraving technique (FIG. 7*a*).

Figure 7B:
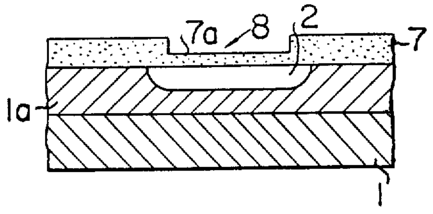

2. An impurity is selectively diffused through the diffusion hole 8, thereby to form a region 2 (FIG. 7*b*).

Figure 7C:
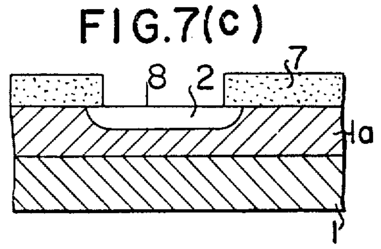

3. The same diffusion hole 8 as that formed in the process (1) is formed again by subjecting an oxide layer 7*a* containing an impurity and formed in the process (2) and the layer 7 used for diffusion masking to simultaneous engraving by utilizing the fact that thickness and etching velocity of said oxide layer 7*a* and those of said layer 7 are different, respectively (FIG. 7*c*). Of course, if thickness of the oxide layer 7*a* is controlled so as to be very thin, said process (3) may be omitted.

Figure 7D:
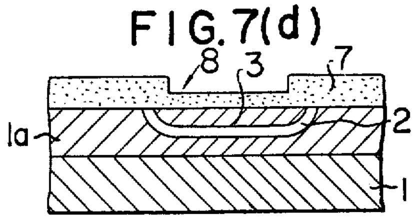

4. Nextly, a region 3 is formed by selective diffusion through the diffusion hole 8 in the same manner as that of the process (2) (FIG. 7*d*).

5. A part of the oxide layer is removed off and a gate insulating layer 5 is formed.

Figure 8:
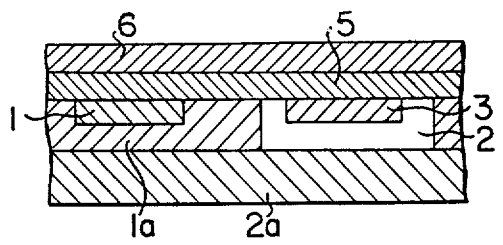
FIG. 8 shows a sectional view of a modification of the example shown in FIG. 4.
Figure 10:
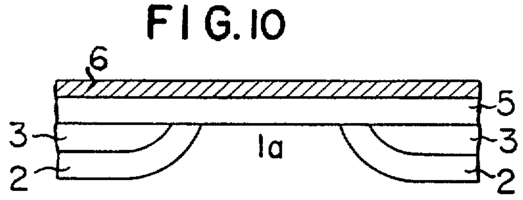
FIG. 10 shows a sectional view of a conventional improved field-effect transistor adapted to high frequency use.

Then, contact holes for leading out terminals are formed and a gate electrode metal is deposited by evaporation, and said deposited metal layer is subjected to photoengraving, whereby a gate electrode 6 and electrodes to be connected to the gate electrode 6, source region, and base region forming a channel therein are formed. Electrical contact to the drain region is achieved from rear sides of the transistor, but it may be also possible to make the electrical contact to the drain region from the surface, by the diffusion of the same type of impurity as the source providing a metallic electrode at said diffused portion. In the case of other example of this improvement, shown in FIG. 8, a portion becoming a drain region having a low impurity concentration is previously provided on a substrate 2*a* and then the region 2 forming a channel therein and source region 3 are formed from the same diffusion hole. In this case, if a diffusion hole is formed in the diffusion masking oxide layer on the region acting as a drain region having a low impurity concentration prior to diffusion of the source region, the drain region 1 can be diffused at the same time as the diffusion of the source region 3. According to the structure shown in FIG. 8, since the substrate 2*a* has the same inpurity type as that of the region 2 in which the channel is formed, an isolation diffusion as needed in the example of FIG. 6 is not necessary. In the example of FIG. 8, when the drain region 1 and source region 3 are made to be mutually near in such a degree as that depletion layer spreads toward the drain region 1*a* having a low impurity concentration within practical voltage range, large current can be handled, but such highly accurate photoengraving as in the case of obtaining the short channel length $L_c$ by the conventional technique is not required.

The above-mentioned examples of the improvement relates to the cases in which double diffusion is adopted, but the improvement may also be embodied by using alloying together with diffusion. This example is shown in FIG. 9, method of manufacturing said example being described as follows.

Figure 9A:
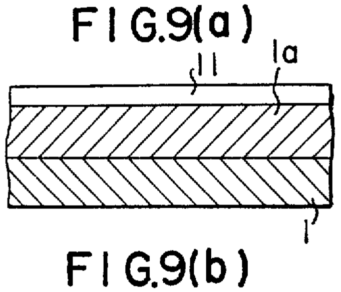
FIGS. 9 (*a*), (*b*), (*c*), (*d*) and (*e*) show, respectively, processes for manufacturing the example of FIG. 4.
Figure 9D:
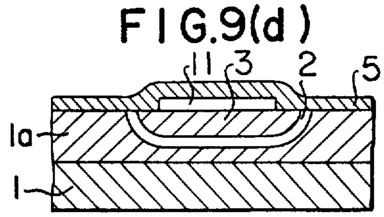
Figure 9B:
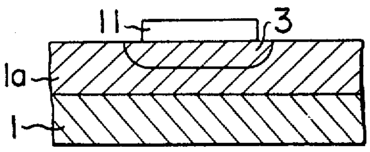
Figure 9E:
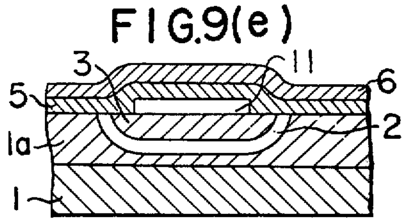
Figure 9C:
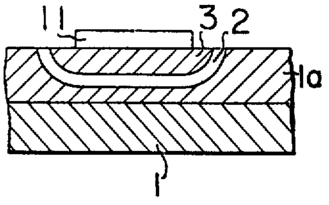

1. Firstly, a metal 11 containing an impurity of opposite conductivity type to that of a drain region 1*a* and capable of forming silicide (or compound of silicon and metal) is deposited by evaporation (FIG. 9*a*).
2. Secondly, photoengraving necessary for a source region is carried out and maintaining the device in a high temperature atmosphere in order to produce silicide, thereby to produce the source region 3 (FIG. 9*b*).
3. Thirdly, the impurity contained in the metal is made to diffuse at a temperature lower than the temperature adapted to form silicide, thereby to provide a region 2 forming a channel therein (FIG. 9*c*).
4. Fourthly, a gate insulating layer 5 is made to adhere according to a means such as vapor-phase reaction (FIG. 9*d*).
5. Fifthly, a gate electrode 6 is deposited by evaporation (FIG. 9*e*).

In carrying out the above-mentioned processing, a schottky junction between the metal layer 11 and region 2 may be utilized as the source junction by means of utilizing a metal which cannot produce the silicide. Furthermore, it may be possible that in the case when deterioration of the semiconductor surface may occur, a protection layer may be provided on the semiconductor surface prior to or after adhesion of the metal layer 11 in the process of forming the silicide.

According to these improvements, as clear from the description relating to the examples mentioned above the frequency limit of the field-effect transistor can be improved to a value corresponding to ten times of those of the conventional transistors. Furthermore, since the depletion layer spreads toward the drain region and, channel length and drain break-down voltage can be independently designed, whereby phenomenon at the drain region can be controlled by varying channel current from the gate electrode.

High frequency characteristics of a field-effect transistor are essentially determined by its channel length L and gate-drain feedback capacitance $C_{gd}$, and the more these parameters are decreased, the more said characteristics become excellent. The channel length of the field-effect transistor can be easily made less then 1 μ by the methods mentioned in connection with FIGS. 4 to 9 and a field-effect transistor having an intrinsic cut-off frequency $f_{co}$ of the order of several tens gigaherz can be easily obtained. On the other hand, however, the excellence of the frequency characteristics of a insulated gate field-effect transistor depends upon the gain band width product $f_T$ and the more said product $f_T$ is larger, the more said transistor can be used for higher frequency. If we let it be now assumed that the transconductance of insulated gate field-effect transistor (IGFET) and the sum of input and output capacitances are, respectively, represented by $g_m$ and C, the value $f_T$ in the case of using the transistor under a resistive load can be represented by the following equation.

$$f_T = \frac{g_m}{2\pi C} \qquad (1)$$

Now, when an amplifier having a gain A is manufactured by IGFET, cut-off frequency *respectively*, *T* of the amplifier can be represented by the equation obtained by putting C of the following equation into the equation (1).

$$C = C_{ds} + C_{gs} + (1 + A)\, C_{gd} \qquad (2),$$

where $C_{ds}$, $C_{gs}$ and $C_{gd}$ represent, rspectively, drain-source capacitance, gate-source capacitance, and gate-drain capacitance. Accordingly, the equation (1) can be represented by the following equation.

$$f_T = \frac{g_m}{2\pi\left\{ C_{ds} + C_{gs} + (1+A)\, C_{gd} \right\}} \qquad (3)$$

In the equation (3), since the capacitance $C_{gd}$ is not zero, when the gain A is designed so as to be larger, the gain band width product $f_T$ becomes small. Accordingly, the capacitance $C_{gd}$ must be selected to be small as much as possible in order to obtain an amplifier having a high performance.

FIGS. 4, 5 and 6, there are shown IGFET's channel length of which can be made to less than 1 μ, said transistor comprising gate insulating layer 5, a gate electrode 6, a drain region 1*a*, a base region 2 in which a channel is formed, and a source region 3. According to such structure as mentioned above, since the substrate is used as the drain region, a gate electrode or is provided on the gate insulating layer formed on the surface of substrate drain region according to the conventional method, the capacitance between said gate electrode and the substrate is added additionally to the above-mentioned capacitance $C_{gd}$, thereby to lower the performance of the transistor owing to the reason mentioned already. That is, in the transistor transistors in FIGS. 4, 5, 6 and 10, the thickness of the insulating layer portion formed just above the drain region 1*a* cannot be increased more than the thickness of the gate insulating layer 5, and feedback capacitance $C_{gd}$ cannot be decreased to a value not to affect the frequency characteristics of transistors.

The above-mentioned disadvantage can be effectively avoided, according to this invention, by providing a thick insulating layer on said surface of substrate drain region as a portion of the gate insulating layer thereby decreasing the feedback capacitance $C_{gd}$ without tight tolerance of the photoengraving technique.

Figure 11A:
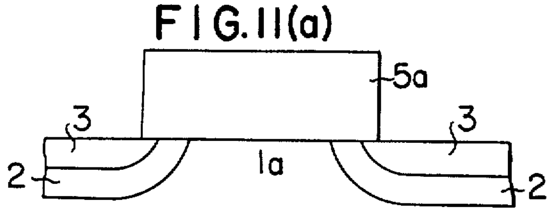
FIGS. 11 (*a*), (*b* ) and (*c*) show, respectively, sectional views for describing processes for manufacturing an example according to the invention, said example being an improvement of the transistors shown in FIGS. 4, 5, 6, 8 and 10.
Figure 11B:
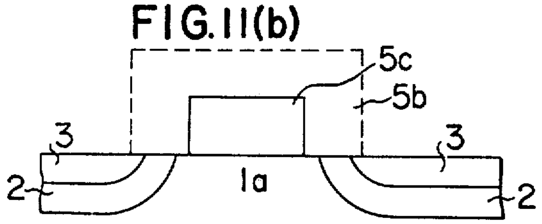
Figure 11C:
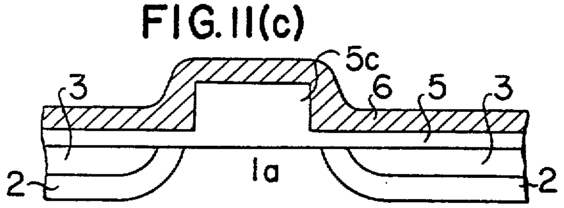

FIG. 11 shows the method of increasing the thickness of said insulating layer portion above the drain region 1*a*. According to the method of FIG. 11; as shown in FIG. 11(*a*), a thick insulating layer 5*a* having a desired shape is formed on a semiconductor substrate a portion of which is used as a drain region 1*a*, and then base regions 2 and source regions 3 are formed by diffusion processes by using twice the same insulating layer as a diffusion mask. Then, as shown in FIG. 11(*b*), a portion 5*b* of the insulating layer 5*a* is removed by dissolution thereof, thereby to remove the thick insulating layer at the positions just above the surface of base regions 2, but to remain the insulating layer of 5*c* just above the drain region 1*a* as much as possible. This removing treatment can be efficiently attained for example by using etchant consisting of a water solution of ammonium fluoride and hydrofluoric acid for $S_iO_2$. Lastly, as shown in FIG. 11(*c*), a thin insulating layer the thickness of which is thinner than that of 5*c* is made on the surface of exposed semiconductor regions to form a gate insulating layer 5 comprising said thick insulating layer 5*c* and this thin insulating layer and a gate electrode 6 is deposited on said layer 5 by evaporation, said electrode being photoengraved to its desired dimension after said deposition, whereby a field-effect transistor having a relatively thick insulating layer on the drain region 1*a* can be obtained.

According to the structures of the examples shown in FIG. 11, the capacitance between the drain region and gate electrode can be reduced to less than ½ of that of the conventional field-effect transistor, so that an excellent field-effect transistor capable of achieving a very stable amplification at a frequency range near the intrinsic cut-off frequency of the transistor element itself can be obtained.

We claim:

1. A method of manufacturing a field-effect transistor comprising base, source and drain regions, a gate electrode and a gate insulating layer, which comprises the steps of:

a. forming a thick insulating layer, having a thickness which is greater than the diffusion length of an impurity forming a base region in a following process step, on a surface of a semiconductor substrate including an impurity of a first conductivity type;

b. removing a portion of said thick insulating layer from the surface of said semiconductor substrate to leave at least one island-like portion of said thick insulating layer on said surface;

c. diffusing first and second impurities successively into said surface of said substrate while using said island-like portion as a diffusion mask to form base and source regions, respectively, in said substrate by diffusing said first impurity to a greater depth than said second impurity, said first impurity being of a second conductivity type opposite to said first conductivity type and said second impurity being of said first conductivity type whereby said substrate becomes a drain region;

d. etching away a portion of said island-like insulating layer to leave a portion of said island-like insulating layer on the surface of said drain region and to expose the surface of said base region;

e. forming an insulating layer thinner than the thickness of said remaining-island like insulating layer on the exposed surface of said base, source and drain regions to form a gate insulating layer consisting of said island-like insulating layer and said thin insulating layer; and f. then forming a gate electrode on said gate insulating layer.

* * * * *